United States Patent [19]

Baranowski

[11] 4,104,701
[45] Aug. 1, 1978

[54] MOUNTING ASSEMBLY FOR ELECTRONIC POWER DEVICES

[75] Inventor: Conrad J. Baranowski, Arlington Heights, Mass.

[73] Assignee: Powercube Corporation, Waltham, Mass.

[21] Appl. No.: 744,137

[22] Filed: Nov. 22, 1976

[51] Int. Cl.² .............................................. H05K 7/20
[52] U.S. Cl. ................................... 361/386; 361/398; 361/389
[58] Field of Search ............................ 165/80; 357/81; 174/16 HS; 361/386–389, 395, 398, 380

[56] References Cited
U.S. PATENT DOCUMENTS

| 3,522,486 | 8/1970 | Johns et al. | 361/398 |
| 3,761,439 | 10/1973 | Isaacson | 361/398 |

Primary Examiner—Gerald P. Tolin
Attorney, Agent, or Firm—Weingarten, Maxham & Schurgin

[57] ABSTRACT

An assembly for mounting electronic power devices to a flexible circuit board and in an enclosure. A slotted plastic button is mounted to the built-in heat sink portion of the power device and a spring member is mounted between two such power devices. The spring forces the heat sink surfaces of the power devices against opposite walls of the enclosure and transmits insertion forces to the flexible board during assembly.

17 Claims, 7 Drawing Figures

MOUNTING ASSEMBLY FOR ELECTRONIC POWER DEVICES

FIELD OF THE INVENTION

This invention relates generally to modular electronic circuit packaging and more particularly concerns a device for positively mounting power devices in an enclosure and combining such power devices with a flexible circuit board.

DISCUSSION OF THE PRIOR ART

Electronic power devices, normally semiconductors, are normally formed with an insulating package and a surface on one side which functions as a heat sink. This surface may be electrically or thermally conductive or both. The heat sink portion normally has a hole therethrough by which the power device is secured to a larger surface, such as a heat sink or the wall of an enclosure, by means of screws or bolts. Alternatively, such power devices could be secured by some type of adhesive or by soldering.

An example of such a device and the mounting thereof to a larger surface is shown in U.S. Pat. No. 3,641,474. Another means for mounting a heat sink to a power device is shown in U.S. Pat. No. 3,566,958 wherein two radiating type heat sink elements are clamped by means of spring devices to either side of the power electronic component. The former patent is a good example of a conventional mounting means in this particular technical area and it may be noted that the power device could be replaced by removing the bolt and disconnecting the leads which may be inserted into a socket or soldered to circuitry as appropriate. This prior art structure involves the semipermanent mounting of the power device to the heat sink or wall of an enclosure.

SUMMARY OF THE INVENTION

It is an object of this invention to connect electronic power devices to circuit sub-assemblies which are then mounted in an enclosure wherein positive heat sink surface contact is made to the enclosure walls but no permanent connection is made thereto.

Broadly speaking, this invention is concerned with a spring member extending between two oppositely disposed power devices wherein the coupling between the spring member and each of the devices comprises a slotted plastic button which positively holds the spring and the power device together and is so configured as to absorb significant tolerances in the sizes of the holes in the power device and in the size of the spring member. The plastic button is formed with a cylindrical projection having an axial blind hole extending from the opposite side into the cylinder, and a radial slot through the button extending from the axis of the hole. Viewed from the side opposite the cylinder, the hole forms a key-shaped opening in conjunction with the slot. The cylindrical projection extends into the hole in the heat sink portion of the power device and the slot absorbs variations in the hole diameter. The end of the spring device extends into the hole in the opposite side of the button and the slot absorbs variations in diameter of the spring device. The connection between the spring device and the hole in the button is a force fit, as is the cylindrical projection mounted in the hole in the heat sink.

BRIEF DESCRIPTION OF THE DRAWING

The objects, advantages and features of this invention will be clearly understood from the following detailed description when read in conjunction with the accompanying drawing in which.

DESCRIPTION OF THE PREFERRED EMBODIMENTS

Figure 1:
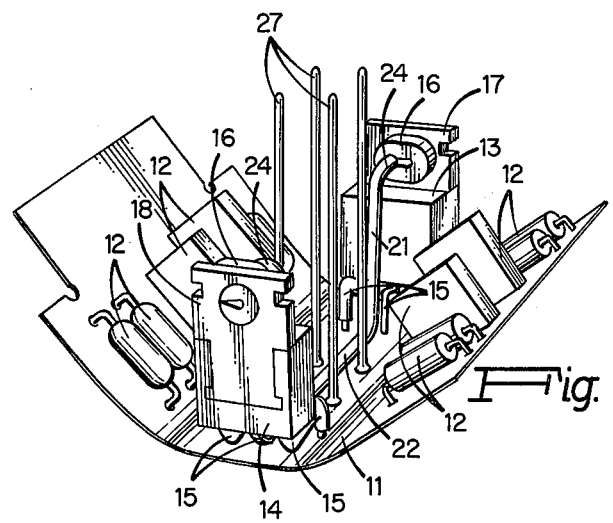
FIG. 1 is a perspective view of the assembly of this invention wherein the power devices are mounted to a flexible circuit board shown in a partially folded condition.
Figure 3:
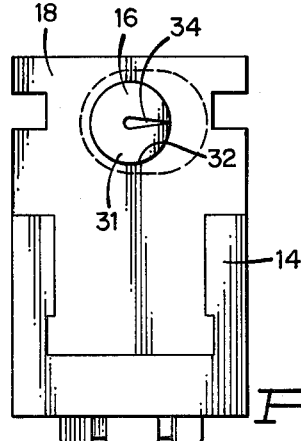
FIG. 3 is an enlarged side view of a power device with one embodiment of the button of the present invention mounted thereto.
Figure 2:
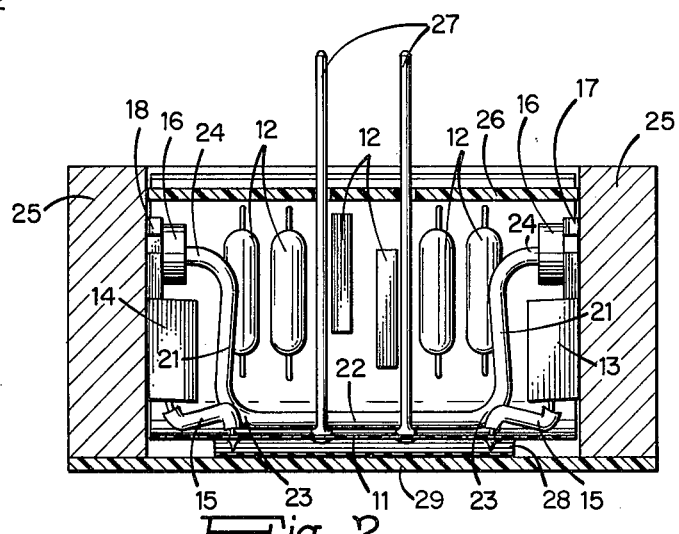
FIG. 2 is a sectional view of the invention shown in FIG. 1 wherein the assembly is mounted in an enclosure.

With reference now to the drawing and more particularly to FIGS. 1-3 thereof, there is shown a flexible circuit board 11 having various electronic components 12 mounted thereto. When in use the sides of the flexible board are substantially parallel but are shown somewhat open in FIG. 1 for purposes of clarity. At the bottom central portion of the U-shaped flexible circuit board adjacent opposite edges are mounted electronic power devices 13 and 14. These are normally semiconductors such as power transistors and have a plurality of leads 15 which are soldered to the circuit board in normal fashion. It should be noted that leads 15 are S-shaped as shown in the drawing, the function of which will be discussed in greater detail below. A plastic button 16 is shown mounted to power device 14 with a cylindrical projection 31 completely surrounded by heat sink area 17 (FIG. 3). Heat sink 18 is mounted flush with and extends beyond one edge of the power device. The other side of plastic button 16 is visible on power device 13 in FIG. 1.

Extending between power devices 13 and 14 is spring member 21 having a flared U-shaped configuration. The bottom portion 22 of the spring member rests against the top surface of flexible board 11 and bends 23 are typically located between leads 15 of the power devices which are connected to the circuit board. Outwardly flared end portions 24 of the spring extend into buttons 16 and are thereby secured to power devices 13 and 14.

The entire assembly shown in FIG. 1 is mounted in an enclosure having walls 25 as shown in FIG. 2. The walls of the enclosure are normally heat conductive but are often formed with an anodized coating such that they are electrically insulative. However, the particular surface characteristics of the enclosure do not form any part of the present invention. Spring member 21 is in compression as shown in FIG. 2, that is, end portions 24 are forced toward each other, thereby holding the heat sink surfaces 17 and 18 of respective power devices 13 and 14 flush against the walls of the enclosure. In order to insure that the surfaces of heat sink elements 17 and 18 remains flat against walls 25, the S-shaped bends of leads 15 are formed so that flexibility is provided between the bottom of power devices 13 and 14 and the flexible board 11. Leads 15 themselves act as springs and, with the S-shaped bend, force the bottom portions of the power devices against walls 25 so that the force of spring member 21 does not tend to orient the power devices at an angle against the walls of the enclosure. Thus the S-shaped leads allow for adjustability in mounting the device to the flexible circuit and provide spring pressure to assist in making good thermal contact between the device heat sink surface and the wall of the enclosure. An insulative sleeve is shown on leads 15 and is typically used to prevent accidental electrical shorting.

Normally a hard or rigid printed circuit board 26 extends across the tops of power devices 13 and 14 making physical contact therewith. When the assembly of FIG. 1 is mounted in the enclosure of FIG. 2, downward pressure is applied to the circuit board 26. This force is transmitted through power devices 13 and 14 and spring member 21 to flexible board 11 such that the entire assembly can be inserted between walls 25 of the enclosure. Note that with this structure, there is no stress upon leads 15 during assembly but that the entire downward force exerted upon board 26 is transmitted through spring 21 wherein central portion 22 contacts the flexible circuit board. Upstanding terminal pins 27 are electrically and physically connected to flexible board 11 and extend through rigid board 26 to which they may be electrically connected or not, as desired. These terminals provide for external electrical connection of the assembly shown in the drawing. The combination of spring 21, power devices 13, 14 and plastic buttons 16 may be referred to as a power subassembly. Note that the electronic components 12 mounted to circuit board 11 are interleaved with spring 21, contact pins 27, power devices 13, 14 and themselves, but do not interfere with any of the components of the power sub-assembly. A thin insulating sheet 28 is normally provided between the printed circuitry surface of flexible board 11 and side walls 25 and the bottom 29 of the enclosure.

Figure 4:
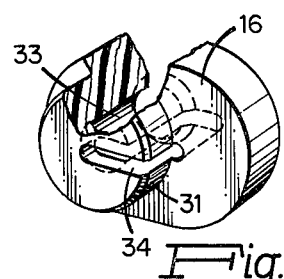
FIG. 4 is a perspective view of the button shown in the power device in FIG. 3 on a greatly enlarged scale.

Plastic button 16 is shown in detail in FIGS. 3 and 4. This button may be made from any suitable plastic such as an acetal resin having relatively high temperature characteristics but which allows plastic flow as necessary, typical material examples being sold under the trademarks Delrin and Celcon. Button 16 is oval-shaped and is formed with a cylindrical projection 31 extending through hole 32 in heat sink 18 of power device 14. The other side of button 16 which projects outwardly from the surface of heat sink 17 as shown in FIGS. 1 and 2 is formed with a blind hole 33 through a substantial portion of the thickness of button 16. This hole is shown extending into and is axially aligned with cylindrical projection 31. An oval slot 34 centered with respect to the oval exterior shape of button 16 extends entirely through the thickness of the button and projects radially from the axis of hole 33. Thus as viewed from the side of power device 13 as shown in FIG. 1, the combination hole 33 and slot 34 assume that appearance of a keyhole.

The specific dimensions are not critical but size relationships are important and typical dimensions are set forth to assist in visualizing these relationships. Hole 32 in heat sink 18 passes entirely through the heat sink and has a diameter typically 0.139 to 0.147 inch (3.53 to 3.73 mm). The diameter of projection 31 of button 16 would in such case be 0.151 inch (3.84 mm), such that even with the relatively large tolerance of hole 32, there will be a press fit of projection 31 into that hole. The slot 34 passing through projection 31 accommodates the press fit and any variations in tolerance of the hole in the heat sink. Thus, as shown in FIG. 3, slot 34 assumes a narrow pie shape when projection 31 is forced into the hole in the heat sink.

The spring member 21 is made of appropriate material such as music wire having a nominal diameter of 0.067 inch (1.702 mm) and having an electrically insulative coating which may be made of a plastic or an epoxy, a typical example being parylene, and adds 0.002 to 0.008 inch (0.051 to 0.203 mm) to the diameter of the wire. Blind hole 33 in button 16 has a nominal diameter of 0.066 inch (1.68 mm) so that there is a substantial press fit between the end 24 of the wire and hole 33. Slot 34 accommodates this press fit together with any tolerances in the diameter of the wire and coating size so that there is a positive connection between the end of the spring wire and button 16. Because of slot 34, the button can expand as necessary to receive the wire and is not ruptured in any way. Thus the slot which passes entirely through button 16 accommodates an external inwardly directed compression force acting on cylindrical projection 31 and accommodates an outwardly directed expansion force acting upon blind hole 33 while maintaining both hole 33 and cylindrical projection 31 in substantially cylindrical configuration, that is, without causing a cone shape to be formed resulting from the combination of press fits. The thickness of heat sink 17 ranges from 0.045 to 0.055 inch (1.143 to 1.397 mm) and the cylindrical projection 31 extends from the body of button 16 by approximately 0.045 inch (1.143 mm). Thus this projection will not extend beyond the flat surface of heat sink 17 which makes contact with the wall 25 of the enclosure as shown in FIG. 2.

Figure 6:
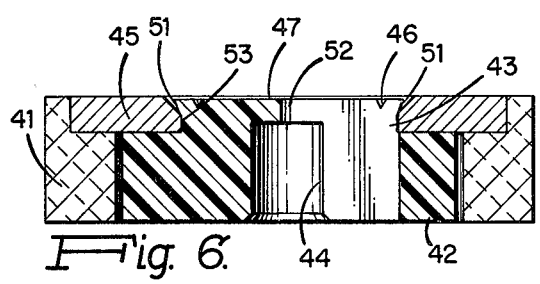
FIG. 6 is a greatly enlarged sectional view of the power device of FIG. 5 taken along cutting plane 6—6 showing the button mounted to the heat sink thereof.
Figure 5:
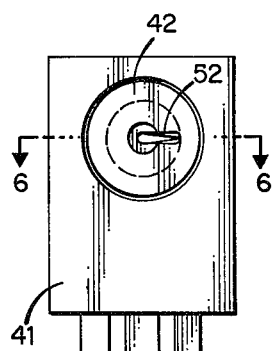
FIG. 5 is a side view of a second power device with a second embodiment of the button of this invention mounted thereto.

The semiconductor 41 as shown in FIG. 5 has a slightly different configuration wherein the heat sink is mounted or embedded in one side of the power device as opposed to extending beyond one end of the power device as is the case with the semiconductor of FIG. 3. The plastic button 42 has basically the same configuration and operates in the same manner as button 16 but because the hole in the semiconductor and the heat sink is larger than the power device of FIG. 3, there is no need for an oval configuration to accommodate the slot. Thus button 42 is round and both cylindrical projection 43 and blind hole 44 are axially located with respect to the external diameter of the button. Heat sink 45 as shown in FIG. 6, is normally approximately 0.031 inch (0.787 mm) thick but has a countersink or chamfer on the outwardly facing side of hole 53 which extends approximately half way through the thickness of the heat sink. Because less than the full circumferential surface area of projection 43 makes frictional engagement with heat sink 45, it has been found advantageous to add a ring stake 46 to the outwardly facing circular surface 47 of the projection, thereby causing plastic material 51 to flow partially into the chamfered area. By adding the ring stake, the connection between button 42 and heat sink 45 is quite positive. The slot 52 in button 42 acts in the same manner as slot 34 in button 16 and absorbs the tolerance variations in the hole 53 in heat sink 45 and in the outside diameter of the coated spring member 21 within hole 44.

Figure 7:
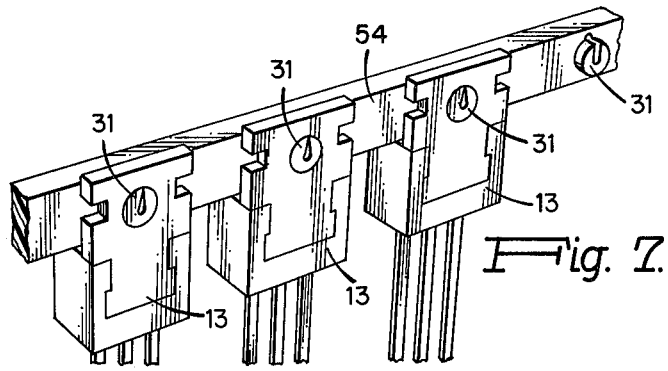
FIG. 7 is a perspective view of several power devices mounted to buttons formed in ganged fashion on a continuous strip.

As an alternative configuration, the cylindrical projection 31 of buttons 16 may be ganged together on a connecting strip 54 both for ease of manufacture and for registration of several power devices 13 as shown in FIG. 7. These interconnected buttons have the same configuration and function in the same manner as the button previously discussed.

The present invention provides several significant advantages in the component packaging art to which it pertains. By providing a positive connection between spring member 21 and oppositely disposed power devices such as 13 and 14 by means of the plastic buttons such as 16, the power devices can be easily aligned and maintained in opposite facing relationship so as to maintain the maximum amount of force exerted by spring 21 between the two power devices. This, of course, insures that the power devices are forced against the enclosure walls 25 making excellent thermal contact therewith. Because of the positive interconnection of the spring member and the power devices through the plastic buttons, assembly of the electronic components is facilitated. The spring is not likely to pop out of the button because of the force fit. If the spring were loosely coupled by some means not in accordance with this invention, it could become separated and possibly damage or short other electronic components in the sub-assembly. Furthermore, if it became disconnected, it would not provide the force transmittal from the rigid board 26 to flexible circuit 11 and could result in crushing the leads 15 of the power devices or causing other component damage or failure. Furthermore, spring 21 maintains positive contact with the power devices through the plastic buttons and insures that the power devices remain upright and properly oriented with respect to the flexible circuit which remains flat prior to and during wave or dip soldering. Because the component leads are normally substantially in line and are originally only loosely mounted in holes in the flexible circuit, they would be relatively difficult to control without the spring member 21 connecting them together and aligning them with respect to the flexible printed circuit board prior to soldering. It is also possible that with this positive interconnection between the spring and the power devices, a power sub-assembly of these parts could be made and shipped or handled together and later mounted to a flexible board. This would also permit matched components to be more easily handled, packaged and shipped.

It is likely that in view of the above description, modifications and improvements will occur to those skilled in the art which are within the scope of this invention.

What is claimed is:

1. A modular electronic assembly comprising:
    at least one pair of electronic power devices arranged in spaced confronting relationship;
    a deformable electrically insulating button mounted to each said power device, said button having a blind hole extending from one side thereof part way therethrough and a slot through said button, said slot extending radially from the axis of said blind hole; and
    a spring member extending into each said blind hole, said spring member being arranged between and urging apart said power devices in each said pair of said power devices.

2. The modular electronic assembly recited in claim 1 wherein each said power device is formed with a heat sink surface on one side thereof opposite to the confronting side, said spring member urging said pair of power devices apart in a direction perpendicular to said heat sink surfaces.

3. The modular electronic assembly recited in claim 2 wherein:
    each said power device is formed with a hole therein;
    said button is formed with a cylindrical projection coaxial with and including the blind end of said blind hole, said slot opening through said cylindrical projection, said cylindrical projection extending into said power device hole.

4. The modular electronic assembly recited in claim 3 wherein the connection between said spring member and said blind hole in said button is a force fit and said slot permits sufficient expansion of said blind hole to accommodate tolerance variations in said spring member.

5. The modular electronic assembly recited in claim 4 wherein the connection between said hole in said power device and said cylindrical projection on said button is a force fit and said slot permits sufficient compression of said cylindrical projection to accommodate tolerance variations in said hole in said power device.

6. The modular electronic assembly recited in claim 2 and further comprising:
    a flexible printed circuit board;
    each said power device having leads connected to said flexible board;
    said spring member being U-shaped, the bottom central portion of said U-shaped spring member bearing against the top surface of said flexible board.

7. The modular electronic assembly recited in claim 6 and further comprising:
    an enclosure having spaced confronting side walls;
    said heat sink surfaces being urged by said spring against the interior surfaces of said side walls, said spring transmitting forces to said flexible board when said assembly of said flexible board, power devices, buttons and spring is inserted between said side walls into said enclosure.

8. The modular electronic assembly recited in claim 7 wherein said power device leads are formed into an S-shape whereby adjustability of the position of each said power device with respect to said flexible board is provided and whereby said leads act as spring members urging one end of each said power device in a direction perpendicular to said heat sink surface.

9. The modular electronic assembly recited in claim 8 wherein said spring member is connected to each said power device adjacent the end opposite the end to which said leads are connected, whereby the combination of such spring member and said S-shaped leads urges said heat sink surface flush against said enclosure side wall.

10. A modular electronic assembly comprising:
    at least one pair of electronic power devices arranged in spaced confronting relationship and having a plurality of leads extending from one end thereof;
    a flexible printed circuit board, at least some of said leads being connected to said flexible board; and
    a spring member coupled between and urging apart said power devices, said spring member having a central section bearing against the top surface of said flexible board;

said spring member being coupled to said power device adjacent the end opposite said leads, said leads being S-shaped to permit adjustability of the position of said power device with respect to said flexible board, said S-shaped leads acting as a spring and urging said power devices in the same direction as said spring member.

11. The modular electronic assembly recited in claim 10 and further comprising:
an enclosure having spaced confronting side walls;
said pair of power devices, flexible board, and spring member being mounted within said enclosure, said spring member and said S-shaped leads acting together to urge said power devices in surface contact with said side walls.

12. A modular electronic assembly comprising:
a flexible printed circuit board;
at least one electronic power device having a heat sink surface on one side thereof;
spring means mounted to said circuit board and coupled to said power device, said spring means urging said power device in a direction perpendicular to said heat sink surface, whereby said heat sink surface of said power device is adapted to make confronting contact with a thermally conductive adjacent surface; and
a deformable electrically insulating button mounted to said power device and coupling said spring means to said power device.

13. The modular electronic assembly recited in claim 12 wherein:
said power device is formed with a hole therein;
said button is formed with a slot therethrough and a cylindrical projection, said slot extending radially from the axis of said cylindrical projection;
said cylindrical projection extends into said hole in said power device, the connection between said button and said hole being a force fit, said slot permitting sufficient compression of said cylindrical projection to accommodate tolerance variations in said hole in said power device.

14. The modular electronic assembly recited in claim 13 wherein:
said button is formed with a blind hole coaxial with said cylindrical projection and opening into the side of said button opposite said cylindrical projection, said blind hole extending part way through said button;
said spring means having a member force fit into said blind hole, said slot permitting sufficient expansion of said blind hole to accommodate tolerance variations in said spring member.

15. A modular electronic assembly comprising:
a flexible printed circuit board;
a first electronic power device having a heat sink surface on one side thereof;
a second power device having a heat sink surface on one side thereof and spaced from said first power device in confronting relationship; and
spring means mounted to said circuit board and coupled to said power devices, said spring means comprising a U-shaped wire having the bottom central portion bearing against the top surface of said flexible board, said spring wire engaging both said power devices and urging them apart in a direction perpendicular to said heat sink surface, whereby said heat sink surface of each said power device is adapted to make confronting contact with a thermally conductive adjacent surface.

16. The modular electronic assembly recited in claim 15 and further comprising:
an enclosure having spaced confronting side walls;
both said power devices, spring means and flexible board being mounted within said enclosure with said power devices being in surface contact with opposite side walls of said enclosure and being urged thereagainst by said spring means.

17. A modular electronic assembly comprising:
a flexible printed circuit board;
at least one electronic power device having a heat sink surface on one side thereof;
spring means mounted to said circuit board; and
deformable coupling means mounted to said power device and coupling said spring means to said power device, said spring means urging said power device in a direction perpendicular to said heat sink surface, whereby said heat sink surface of said power device is adapted to make confronting contact with a thermally conductive adjacent surface.

* * * * *